United States Patent [19]

Chin et al.

[11] Patent Number: 5,019,555
[45] Date of Patent: May 28, 1991

[54] HIGH PURITY SUPERCONDUCTING COMPOSITIONS AND METHODS FOR THEIR FABRICATION

[75] Inventors: Jack Chin, Carlsbad; Samuel S. Liang, San Diego, both of Calif.

[73] Assignee: General Atomics, Calif.

[21] Appl. No.: 230,788

[22] Filed: Aug. 10, 1988

[51] Int. Cl.$^5$ ...................... H01B 12/00; H01L 39/12
[52] U.S. Cl. ........................................ 505/1; 423/593; 505/738
[58] Field of Search ...................... 505/738, 1; 423/593

[56] References Cited

U.S. PATENT DOCUMENTS 4,636,378  1/1987  Pastor et al. .......................... 502/525
4,661,282  4/1987  Clark ................................... 423/593

OTHER PUBLICATIONS

Capone, II et al., "Upper Critical Fields and High Superconducting . . . Appl. Phys. Left 5019)", Mar. 2, 1987, pp. 543-544.
Kawai et al., "Preparation of High-Tc Y-Ba-Cu-O Superconductor", Jap. J. of Appl. Phys. vol. 26, No. 5, May 1987, pp. L736-L737.
Kini et al., "High-Tc Superconductor: Selective Preparation and . . ." Inorganic Chemistry, vol. 26, No. 12, 1987, pp. 1834-1836.
Wang et al., "Comparison of Carbonate, Citrate, and Oxalate Chemical . . ." Inorganic Chemistry, vol. 26, No. 10, 1987, pp. 1474-1476.

*Primary Examiner*—Rob R. Dean
*Assistant Examiner*—David W. Schumaker
*Attorney, Agent, or Firm*—Nydegger & Associates

[57] ABSTRACT

The present invention is related to a composition and methods for producing highly pure, high temperature superconducting materials having the general formula $MBa_2Cu_3O_{7-x}$, where M is yttrium or a rare earth element and x is from 0 to 0.5. The superconducting material is produced by first obtaining a solution of yttrium or rare earth element and copper. Next a solution of barium is obtained. The two solutions are heated and mixed together forming a precursor precipitate of the superconducting material. Subsequently, in one embodiment of the invention, the precipitate is recovered, calcined, sintered and slow cooled in oxygen or air. This produces a material having a desirable orthorhomic structure which is superconductive at high temperatures.

Because no organic solvents are used and no pH control other than the amount of barium in the solution is employed, it is possible to provide a highly pure superconducting material.

16 Claims, 1 Drawing Sheet

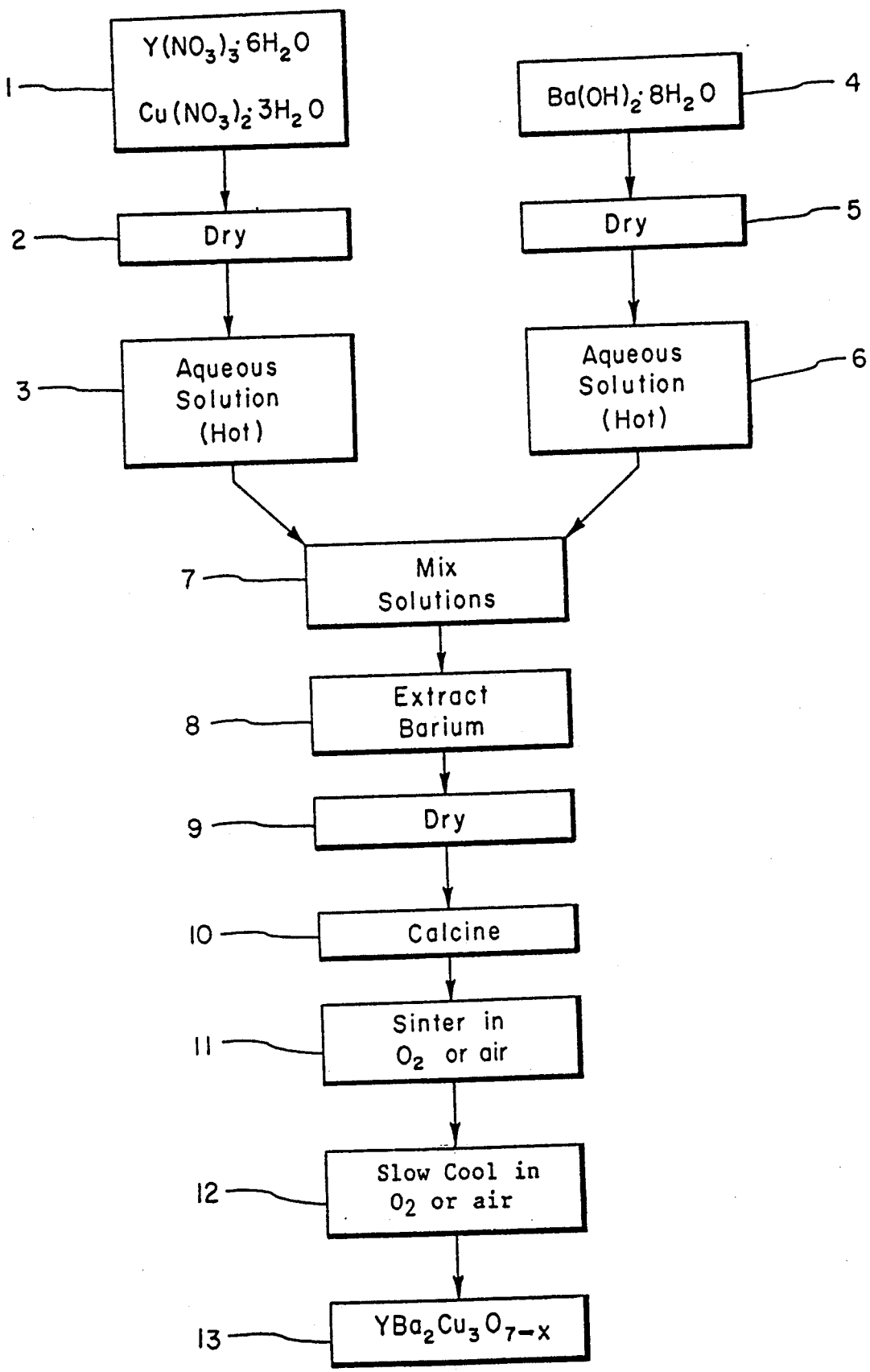

HIGH PURITY SUPERCONDUCTING COMPOSITIONS AND METHODS FOR THEIR FABRICATION

BACKGROUND 1. Field of the Invention

The present invention relates to high temperature superconducting materials and methods for their fabrication. More particularly, the present invention relates to high temperature superconducting materials fabricated in such a manner as to be substantially free from contaminants. 2. Background of the Invention It is now generally recognized that superconducting materials hold a great potential for the advancement of technology. For example, in remarks delivered on July 28, 1987 to the Federal Conference on Commercial Application of Semiconductivity, the President of the United States stated that "to most of us laymen, superconductivity was a completely new term, but it wasn't long before we learned of the great promise it held out to alter our world for the better—a quantum leap in energy efficiency that would bring with it a host of benefits, not least among them a reduced dependence on foreign oil, a cleaner environment, and a stronger national economy."

The phenomenon of superconductivity has been known since the early part of the twentieth century. Superconductivity is generally defined as a condition which exists when a material meets two tests. These tests include (1) zero resistance, and (2) the so-called Meissner effect which comprises the repulsion (2) of a magnetic field much as one magnet repels another. When these two tests are met, a material is classified as superconducting and exhibits some unique properties, most notably zero resistance as mentioned above. It has generally been observed, however, that superconductivity occurs only at very low temperatures. The onset of superconductivity was typically not observed until temperatures dropped to the range of approximately 23K or below.

It is apparent that a material having zero resistance has many important applications. For example, it may be possible to provide superconducting electric transmission lines which would be able to carry electricity without significant loss of electrical power. This would result in the saving of billions of dollars in transmission costs and would allow the development of energy generating facilities, such as nuclear power plants, far from urban centers.

It has also been pointed out that superconductivity may allow motors to be produced which are one-tenth of the normal size. Those knowledgeable of the art have also speculated that superconductive materials would allow the production of high speed trains levitated by magnets, as well as the production of computers which would be smaller and much faster than those presently known. It has also been predicted that new superconductive data transmission lines could be constructed that would carry one trillion bits of information per second, which is approximately 100 times faster than the fiberoptic cables that carry many data transmissions and phone calls at the present time.

The use of superconductivity in these types of devices is not entirely speculative. For example, it has now been reported that the Argonne National Laboratory constructed a superconducting electric motor during late 1987. In addition, certain types of superconducting materials have been known and employed for some time. Niobium superconducting products have been marketed and have been used in various contexts, such as superconducting magnets for research purposes and in certain types of medical equipment.

One of the primary limitations on the development of superconducting products, such as motors, transmission lines, and the like, has been the fact that most superconducting materials must operate only at extremely low temperatures of approximately 4K. In order to produce these extremely low temperatures it is necessary to employ very expensive liquid helium as a refrigerant. Clearly, the extremely low temperatures at which known superconducting materials must operate severely limits their usefulness in practical everyday applications.

Recently, it has been observed that certain types of materials, particularly ceramics, exhibit superconductive properties at temperatures significantly above those of traditional superconducting materials. For example, a ceramic made of lanthanum-barium-copper-oxide has been found to be superconducting at approximately 30K. Indeed, recent developments have shown that other types of ceramic material can be superconducting at the temperature of liquid nitrogen (about 77K or higher). The production of liquid nitrogen is relatively inexpensive and its use is relatively simple. Such materials are often referred to as "high temperature" superconducting materials. That is, they exhibit superconducting properties at temperatures obtainable using liquid nitrogen.

In approximately early 1986, a compound having the general chemical formula $Ba_xLa_{5-x}Cu_5O_{5(3-y)}$ was found to show the features of onset of superconductivity near 30K. Subsequently, findings have been reported with a compound comprised of yttrium, barium, copper and oxygen exhibiting superconductivity in the 80K to 93K range, temperatures well within the range obtainable using liquid nitrogen.

Due to the increase in temperature at which superconductivity is found to exist, it has been theorized that superconductivity ultimately may be found near room temperature. It is apparent, however, that the technique for fabricating such superconducting materials will be an extremely important factor in increasing the temperature at which superconductivity is exhibited.

Superconducting ceramics are often produced by mixing powders together to form a crystalline substance having superconductive properties at low temperature. However, such mixing produces a material having a crystalline structure which is predetermined by the crystalline structure within the powders. It is very difficult using solid mixing techniques to produce mixing at a molecular level because long diffusion times are required to achieve a homogeneous solid.

Certain other types of difficult processes have been developed for the production of superconducting materials. One such process involves the vapor deposition of materials to form a superconducting composition. Vapor deposition is complex because it requires the vaporization of materials that normally exist in a solid state. This procedure requires expensive equipment and highly technical procedures.

It has also been found that superconducting materials can be produced by a coprecipitation process. Generally, the material is dissolved in an organic solvent. Conditions are then adjusted so that a superconducting material will precipitate out of the solution. It is found, however, that the resulting precipitate includes a significant amount of the organic solvent and other chemical species that happen to be present in solution. The presence of carbon-containing contaminates can cause the formation of $BaCO_3$ and other impurities. These and other dissolved molecules may severely disrupt the resulting crystalline structure, either of which will prevent the material from becoming superconductive, cause the material to be superconductive only at very low temperatures, or prevent the material from carrying commercially useful currents While superconductive materials can be formed which contain these materials, it is better if they are not present.

Another problem in coprecipitation processes is the control of pH. In order to maintain the pH of the solution within desirable ranges which produce desirable products, it is generally necessary to add acids or bases to control pH. For example, citric acid and oxylates are often added to the solution. When the superconducting precipitate forms it contains traces of the acids or bases used to control the pH. These substances may also form compounds with these acids or bases which can inhibit the formation of desired superconducting material.

A particular problem is encountered if ammonium hydroxide is added to control pH. The ammonium hydroxide is known to form a complex with copper in solution. One technique used to prevent the copper complex formation is to treat the precipitate with lithium. The treatment with lithium, however, itself adds a trace of lithium to the precipitate. Therefore, it is then necessary to attempt to remove the lithium from the precipitate. Thus, the addition of any unnecessary component to the solution during precipitation greatly increases the complexity of the process.

In summary, it can be seen that any type of material, other than that needed to form the precipitate, will pollute or contaminate the resulting product. Organic solvents and the like are found to become incorporated within the resulting superconductive material Likewise, acids and bases needed to control pH are also found in the resulting precipitate. These pollutants disturb the crystalline structure of the superconductive material.

In order to produce an acceptable superconductor it is necessary for it to have high electrical current capability. This is also produced by a regular grain-to-grain crystalline contact of less than the coherence length (approximately 15 Angstroms in ceramic superconductors). If such a grain-to-grain structure does not exist, the material becomes electrically resistant. It will be appreciated from the discussion above that one way to minimize the grain-to-grain contact distance of polycrystalline materials is to minimize the contaminants in the material. Contaminants are usually found at the grain boundaries and will thus increase the grain-to-grain contact distance.

Accordingly, it would be a major advancement in the art to provide high temperature superconducting materials which were extremely high in purity. It would be another advancement in the art to produce such high purity superconducting materials using solution chemistry in order to avoid the difficulties encountered in producing superconductors by other techniques. It would be a further advancement in the art to provide such superconducting materials using solution chemistry without the necessity of adding contaminants in the form of acids, bases or organic materials into the solution. Specifically, it would be an advancement in the art to use water as a solvent and to control the pH without adding species which do not form a part of the superconducting material.

Such methods and compositions are disclosed and claimed herein.

BRIEF SUMMARY AND OBJECTS OF THE INVENTION

The present invention solves the problems identified above with respect to the production of superconducting materials. The present invention provides methods and compositions for producing materials which exhibit high temperature superconductivity. The material produced using the present invention is high in purity and is able to exhibit superconductivity at temperatures above those obtainable by liquid nitrogen.

The material of the present invention is produced in solution. Thus, the difficult procedures and complex apparatus required to produce superconductive materials by other techniques are not needed. The present invention teaches the use of water as a solvent throughout the process. At the same time, the present invention teaches the use of pH control within the solution without the addition of foreign species. In particular, pH is precisely controlled by varying the relative solution concentrations of the components of the superconducting material.

More particularly, the present invention discloses techniques for fabricating ceramic superconducting materials of the type having the general chemical formula $MBa_2Cu_3O_{7-x}$, using an aqueous coprecipitation process, where M is yttrium or a rare earth element and x is between approximately 0 and approximately 0.5.

One of the important features of the present invention is that no material other than the cations of the salts of the materials which later form the superconducting material, nitrate ions and water exist in solution. This allows one to control the purity of the material by controlling the purity of the starting materials. No acids or bases are added for pH control and no organic solvents or the like are added.

The present invention teaches the use of a solution of barium, barium oxide, barium hydroxide or hydrated barium hydroxide to neutralize the inherent acidity of the solutions used to form the subject superconducting material. Yttrium and copper nitrates tend to form acidic solutions which require pH modification in order to produce a desirable end product. Rather than add separate bases to the solution, as is usually the case in the existing art, the barium component itself is used to neutralize the acidity of the other starting materials. This allows for neutralization of the pH without adding ammonium hydroxide or other such species which tend to complex with the other ions in solution.

The process of the present invention begins with a solution of yttrium (or a rare earth metal) and copper dissolved in the same aqueous solution. While other salts, such as chlorides and sulfates, may also be used, nitrates of yttrium and copper are presently preferred because of the ease of removing nitrates from solution by heating. The yttrium and copper solution is then heated to between approximately 85° C. to approximately 100° C.

Simultaneously an aqueous solution of barium, barium oxide, barium hydroxide, or hydrated barium hydroxide is prepared. This solution is also heated to within the range of from approximately 80° C. to approximately 110° C. The total amount of barium added to the solution is chosen such that there is a slight excess of the amount required to deposit stoichiometric MBa$_2$Cu$_3$O$_{7-x}$.

At this point the yttrium and copper solution is mixed with the barium solution. Since both solutions are heated, the resulting mixture preferably exists at a temperature in the range of approximately 85° C. to approximately 95° C., and more preferably approximately 90° C. Once the two solutions are fully mixed a dark precipitate is formed. This dark precipitate comprises the pure superconducting material.

The superconducting material can be removed from solution by any one of a number of techniques. One technique is to centrifuge the solution to remove the precipitate. Other methods include dipping a substrate into the solution and allowing the precipitate to coat the substrate. Alternatively, methods such as electrophoretic deposition of the material onto a substrate (electrode) can also be employed. Any conventional method of precipitate removal would be acceptable.

At any time during the procedure excess barium can be removed from solution. Barium is typically removed by simply decanting a known amount of liquid from the mixture at a fixed temperature. This provides for both pH control and control of the barium content within the final product.

If it is desired to recover the precipitate, as opposed to coating it onto some substrate, it is generally necessary to dry the resulting slurry. The precipitate, once recovered, is calcined and sintered as desirable.

It will be appreciated that the purity of the final product is assured in that no processing chemicals are introduced. No polluting solvents, acids or bases need to be added in order to produce the superconducting precipitate. Only barium, barium hydroxide or other barium species is used to control the pH in the solution. Since barium is a component of the final product, the use of barium does not add an additional contaminant to the final product.

The present process also takes advantage of both the limited solubility of barium hydroxide in water and the lack of solubility of hydrated oxides of yttrium and copper. These low solubilities may be used as tools in both controlling the pH at any point in the process and the chemical composition of the final product.

Accordingly, it is a primary object of the present invention to provide compositions and methods for producing a highly pure ceramic superconducting material.

It is also an object of the present invention to control the pH of the solution using only components of the final superconducting material and ydrated oxides of yttrium and copper. These low solubilities may be used as tools in both controlling the pH at any point in the process and the chemical composition of the final product.

Accordingly, it is a primary object of the present invention to provide compositions and methods for producing a highly pure ceramic superconducting material.

It is also an object of the present invention to control the pH of the solution using only components of the final superconducting material and thus eliminating the need to add foreign acids or bases.

It is also an object of the present invention to produce the composition of the present invention from an aqueous solution so that organic materials are not incorporated as contaminants into the final precipitate.

These and other objects of the present invention will become apparent from reading the following detailed description of the preferred embodiments and the claims.

BRIEF DESCRIPTION OF THE DRAWINGS

FIG. 1 is a flow diagram illustrating one embodiment of the process of the present invention.

DETAILED DESCRIPTION OF THE PREFERRED EMBODIMENTS

The present invention relates to a high purity superconducting composition and methods for its fabrication and use. The present invention relates to the combining of two solutions to form the superconducting material. Because of the fact that no outside compositions are added, a very pure superconducting material can be obtained. No organic solvents or additional pH controlling acids or bases are added to the solutions such that the resulting material is free from contaminants. As can be seen from FIG. 1, one solution is prepared by forming a solution of yttrium or a rare earth element. This is designated at 1 in FIG. 1. Yttrium and the rare earth elements are acceptable for use in the present invention. Likewise, while yttrium nitrate is illustrated in FIG. 1, other salts of yttrium, such as chloride and sulfate salts, may be substituted. It is also acceptable to use a hydrated nitrate of yttrium as is illustrated in FIG. 1. For example, a compound having the formula Y(NO$_3$)$_3$·6H$_2$O has been found to provide an acceptable end product. Other hydrated forms of the yttrium or rare earth nitrate are also found to be acceptable.

The solution of yttrium (or rare earth element) is then combined with copper in solution to provide a copper and yttrium mixture. Copper in the hydrated nitrate form has been found to be acceptable and is illustrated in FIG. 1. Copper nitrate in the form Cu(NO$_3$)$_2$·6H$_2$O, 3H$_2$O or 2H$_2$O have all been found to be acceptable. Other hydrated forms may also be substituted within the scope of the present invention. In addition, other salts of copper are also acceptable for use within the scope of the present invention.

In some circumstances it may be advisable to dry the yttrium nitrate and copper nitrate salts prior to forming the solution in order to remove some of the water contained within the hydrated substance. This drying step is illustrated at number 2 in FIG. 1. Drying may take place according to any process known and accepted in the art.

The combined yttrium and copper solution is then heated to a temperature in the range of from approximately 85° C. to approximately 100° C. (or the boiling point of the solution). This step is shown at 3 in FIG. 1.

Simultaneously, a barium solution is prepared. Barium is obtained in any one of a number of different forms. These forms may include elemental barium, barium oxide (BaO), barium hydroxide (Ba(OH)$_2$), or a hydrated form of any of the above. For example, Ba(OH)$_2$·8H$_2$O has been found to be an acceptable starting material as is illustrated at 4 in FIG. 1.

Again, it may be advisable to dry the hydrated barium prior to use as illustrated at 5 in FIG. 1. It has been found that drying for an extended period of days at approximately 50° C. has produced an acceptable substance for use in forming the solution of barium. Drying by any other known method will also be acceptable.

The barium is then dissolved to form an aqueous solution of barium, as illustrated at 6 in FIG. 1. The barium solution is brought to a temperature between approximately 80° C. and 110° C. More particularly, it is presently preferred that the solution be brought to a temperature in the range from approximately 94° C. to approximately 98° C.

Once the two solutions have been prepared, it is next preferred to mix the solutions, as designated at 7 in FIG. 1. Various techniques of mixing can be employed. Simply pouring one solution into the other solution is one method that has produced acceptable results. When pouring large volumes of one solution into another, however, it is possible to obtain a precipitate product which is not uniform in composition throughout. The concentrations of the various components within the precipitate product may vary depending on the concentration of the various components at the point of mixing. For example, if the yttrium and copper were poured into the barium solution, the precipitate formed initially may have a high barium content. As more copper and yttrium solution is added, the barium content would then tend to decrease and the yttrium and copper content would tend to increase.

For most purposes it will be advisable to avoid the variation in product composition caused by the mixing technique described above. Accordingly, various techniques can be employed for mixing small volumes at any point in time. For example, it may be desirable to flow small volumes of each solution into a relatively small mixing chamber. Using a technique of this type it will be possible to obtain a product having more uniform composition.

It will be appreciated that using the present invention, pH of the resulting mix can be controlled without adding acids or bases. The barium, barium oxide, or barium hydroxide tends to neutralize the acidic copper and yttrium (or rare earth) solution. By carefully determining which form of barium is used and the concentration of the barium form in solution, it is possible to control the pH in the resulting mixture. This provides the capability of controlling pH in the mixture without the necessity of adding contaminating acids and bases. Thus, the precipitate which is formed when the two solutions are mixed is of extremely high purity, and does not incorporate any extraneous acids, bases, or organic solvents.

It will often be found that the barium solution provides an excess of barium in the final mixture. Accordingly, it is advisable to decant part of the supernatant liquid which contains a relatively high concentration of barium. This step is illustrated at 8 in FIG. 1. Decanting the barium allows one to control the barium concentration in the final product since excess barium continues to be adsorbed on the outside of the precipitate when it is present in solution.

Once the two solutions are mixed, a precipitate forms. Precipitates are formed over the entire range of pH. It is found, however, that the characteristics of the resultant precipitates vary depending on the pH at the point of precipitation. Using the process of the present invention, very desirable superconducting materials are produced at solution pH between approximately pH 3.0 and approximately pH 13. Precipitates formed in the low end of the pH range (below approximately pH 3) are typically found to be greenish and of relatively poor conductivity. Likewise, precipitates formed at high pH (above approximately 11 pH) are found to be black. These black precipitates are found to have lower current carrying capacity than may be desirable for particular uses.

Accordingly, it is presently preferred that the product be formed and precipitated at a relatively neutral pH. For example, precipitates formed at pH's from approximately 6 to approximately 9 have been found to have very good superconductive characteristics at high temperature (above 77K)

It will be appreciated that if the initial products were relatively dilute, the resulting precipitate may remain suspended in the solution. This is in contrast to the situation where the initial starting materials are quite concentrated, resulting in a well-defined precipitate layer. Thus, depending on the concentration of the starting materials and the characteristics of the resulting precipitate, centrifugation may be required in order to remove the precipitate from solution. While other procedures may also be acceptable, it has been found that the centrifugation technique has produced a desirable and acceptable product.

Once a precipitate of the type described above has been formed in the solution, it is generally necessary to dry the product before use. The drying step is illustrated at 9 in FIG. 1. Drying can take place by simply heating the precipitate to drive off any excess moisture. This procedure can satisfactorily take place while the precipitate and any supernatant liquid are continuously stirred and as the entire mixture is heated such that moisture is driven off of the product.

After the stir drying has been completed, it may be necessary to further remove excess water and to fix the material. It is, therefore, sometimes desirable to add a calcing step as is illustrated at 10 in FIG. 1. For example, one calcining procedure that has been found to be acceptable is to heat the recovered precipitate to between approximately 400° C. and approximately 1000° C. in air or oxygen for approximately one hour. More particularly, good results are achieved by calcining at a temperature between approximately 600° C. and approximately 950° C. The nitrates are driven off in this calcining step. This allows the precipitate to stabilize and minimizes degradation of the product. It will be appreciated that the calcining step can be incorporated within the sintering step illustrated at 11 in FIG. 1.

Once the product has been dried and calcined, it is often desirable to sinter the material, as shown at 11 in FIG. 1. During the sintering and slow cool down step 12, oxygen is allowed to diffuse into the material fixing the oxygen content and crystal structure of the product. Sintering may take place at from approximately 650° C. to approximately 950° C. in the presence of oxygen. It will be appreciated that a sintering temperature above the point at which barium carbonate is stable is preferred in order to remove traces of barium carbonate found within the precipitate. This temperature is typically above 900° C. Thus, it will be appreciated that the sintering and calcining steps help to remove any impurities which may have found their way into the product.

Sintering above 900° C. removes carbonate from the $YBa_2Cu_3O_{7-x}$ but also depletes the oxygen content of this material below what is needed to produce the high temperature superconducting material. This oxygen is replaced either by slowly cooling to 400° C. in oxygen or by rapidly cooling to 400–460° then holding for an extended period at about oxygen. This lower temperature is also needed to stabilize the tetragonal to orthorhombic phase transition. The orthorhombic phase is the desired superconducting phase of the $YBa_2Cu_3O_{7-x}$ material.

The above-described process produces a very pure $MBa_2C_3O_{7-x}$ superconducting material. If the calcining and sintering steps have been performed, the resulting material will exist in a powdered form as indicated at 13 in FIG. 1. It is found that for most superconducting applications, a material in the powdered form is preferred.

Alternatively, for certain specialized applications it may be desirable to use the material in different forms. For example, a substrate may be dipped into the suspension which exists at 7 in FIG. 1. The dipping step will result in a coating of a precursor of the superconducting material. Examples of substrates are $ZrO_2$, MgO, silver, noble metals and $BaF_2$. Any substrate that is chemically compatible with the superconducting material and which has a similar coefficient of thermal expansion may be used as a substrate.

An additional method of use is to go through an electrophoretic coating process. The coprecipitated material is first incorporated into an aqueous medium. The pH is adjusted to produce a colloidal suspension of the material. At this point, an electrical potential is applied to electrodes immersed in the suspension to cause electrophoretic deposition of the material on the electrodes. The electrodes may, for example, be fine noble metal wires, nickel-based alloys, noble metal coated wires or other filaments chemically compatible with the superconducting material. Once the material is properly applied, a superconducting film can be made adherent. The film can then be dried and annealed in an oxidizing atmosphere to produce a superconducting film on the substrate.

One of the very significant features of the present invention is its ability to form a very pure final product. Purity is assured by not introducing process chemicals to form the superconducting material which may later need to be removed. Thus, no contaminants are found within the superconducting material in that no potentially contaminating materials are used during the process. The results of the process are superconducting materials having superconducting properties up to approximately 100K.

As was discussed above, the superconducting material formed by the above process has the chemical formula $MBa_2Cu_3O_{7-x}$, where M may be yttrium or a rare earth element. The rare earth elements (lanthanide series) include lanthanum, cerium, praseodymium, neodymium, promethium, samarium, europium, gadolinium, terbium, dysprosium, holmium, erbium, thulium, ytterbium, and lutetium. Any of the above elements may be substituted for yttrium to form the composition of the present invention. In the formula (x) is expected to be in the range of from approximately 0 to approximately 0.5.

EXAMPLES

The following examples are given to illustrate the methods and compositions of the present invention but are not intend to limit the scope of the present invention.

EXAMPLE 1

This example describes a method for forming a high purity, high temperature superconducting composition within the scope of the present invention. The composition has the chemical formula $YBa_2Cu_3O_{7-x}$.

A solution was prepared by combining 38.2 grams of hydrated yttrium nitrate, 70.0 grams of hydrated cupric nitrate with 100 milliliters of distilled water. The resulting solution was heated to approximately 92° C. in a beaker designated beaker "A."

Simultaneously, 127 grams of hydrated barium hydroxide was dissolved in 1000 milliliters of distilled water. The solution was placed in a beaker designated beaker "B" and brought to a temperature of approximately 100° C.

The contents of beaker A were dropped into beaker B. After the combined solutions were allowed time to react, 1300 milliliters of distilled water were added to the resulting mixture.

The mixture was then poured into four 750 milliliter bottles for centrifuging. A Beckman GPR table top centrifuge was used for sedimentation of precipitates. Samples were centrifuged at 25° C. for 25 minutes at 3800 RPM. After centrifugation, precipitates were found on the bottom of each bottle.

Following centrifugation, 300 milliliters of clear solution were decanted from each bottle. The remaining solution and precipitate were poured back into beaker B for drying. Drying was accomplished by placing beaker B on a hot plate maintained at the low setting and stirring until essentially all fluid was removed and a dried powder resulted.

Dried powders were then separated with slight grinding and calcined at approximately 600° C. in air for one hour.

The powder recovered from the procedure set forth above comprised a high purity superconducting composition having the formula $YBa_2Cu_3O_7$. The composition exhibited superconducting characteristics, after sintering in oxygen at 900–970° C. and after a slow cool to room temperature, at temperatures as high as approximately 93K.

EXAMPLE 2

This example describes the preparation of a high purity superconducting composition within the scope of the present invention. The composition has the chemical formula $YBa_2Cu_3O_{7-x}$.

A solution was prepared by combining 38.2 grams of hydrated yttrium nitrate, 71 grams of hydrated cupric nitrate and 100 milliliters of distilled water. The solution was placed in a beaker designated beaker "A" and brought to a temperature of 98° C.

Simultaneously, a second solution was prepared by combining 126.2 grams of hydrated barium hydroxide with 1000 milliliters of distilled water This second solution was placed in a beaker designated "B" and brought to a temperature of 96° C.

The contents of beaker A were mixed with the contents of beaker B. The resulting mixture was found to have a pH of approximately 7.18. A precipitate formed and was recovered by centrifugation as described in Example 1.

In order to dry the recovered product, the product was placed in a beaker and the beaker was placed in a bath of water at approximately 77° C. The contents of the beaker was mixed with a quarter inch rotating drill This procedure continued until essentially all liquid was removed from precipitate and a powder was formed.

The dried powder was recovered and calcined at 650° C. in air for one hour and then air cooled. The powder was cold pressed at 25,000 psi and then sintered in oxygen for 12 hours at 970° C., slow cooled to 700° C., then slow cooled to room temperature This procedure produced 84.9 grams of high purity, high temperature superconducting material having the chemical formula $YBa_2Cu_3O_{7-x}$.

EXAMPLE 3

This example describes a process for producing high purity superconducting material within the scope of the present invention, the composition having the chemical formula $YBa_2Cu_3O_{7-x}$.

A first solution was prepared by combining 38.2 grams of hydrated yttrium nitrate, 71 grams of hydrated cupric nitrate and 400 milliliters of water. The combination was added to a buret designated "A" and brought to a temperature of approximately 89° C.

Simultaneously, a solution of 126 grams of hydrated barium hydroxide in 2000 milliliters of water was placed in a buret designated "B" and brought to a temperature of approximately 86° C.

The bottom of each buret was sealed by a valve. A length of outlet tubing was connected to the outlet of the valve of each buret and was in turn connected to a T-joint. The T-joint lead to ⅜ inch plastic tubing forming a coil.

The contents of buret A and buret B were mixed together by opening the respective valves and allowing the solution to flow through the T joint into the plastic tubing. Thus, intimate mixing was accomplished at relatively constant pH and concentration conditions throughout the procedure. The pH of the resulting mixture was found to be approximately 6.89.

Once the mixing was completed, a precipitate formed. The resulting precipitate was then recovered, calcined, and sintered in the same manner as described in Example 2. Following calcining a total of 78.5 grams of a high purity superconducting composition was recovered. Samples of this powder were sintered and cooled according to the procedures described in Example 2. The composition had the chemical formula $YBa_2Cu_3O_{7-x}$. Samples of this powder were sintered according to the procedures described in Example 2.

EXAMPLE 4

This example describes a process for producing high purity superconducting material within the scope of the present invention.

The same procedure as that described in Example 1 was used. In this procedure 38.2 grams of hydrated yttrium nitrate and 75.5 grams of hydrated cupric nitrate were combined with water to form an aqueous solution. Simultaneously, 126.2 grams of hydrated barium hydroxide was dissolved in water. The two solutions were combined in the same manner as described in Example 1. Similarly, the resulting precipitate was recovered and processed according to the teachings of Example 2.

The final product was a high purity superconducting composition having the following Y/Ba/Cu mole ratio 1/.3/3.3.

EXAMPLE 5

This example describes a process for producing high purity superconducting material within the scope of the present invention.

The same procedure as that described in Example 1 was used. In this procedure 38.2 grams of hydrated yttrium nitrate and 72 grams of hydrated cupric nitrate were combined with water to form an aqueous solution Simultaneously, 127 grams of hydrated barium hydroxide was dissolved in water. The two solutions were combined in the same manner as described in Example 1. Following mixing of the two solutions, 1200 milliliters of a total of 2400 milliliters of total solution were removed in order to control the barium content of the final product. The resulting precipitate was recovered and processed according to the teachings of Example 2.

The final product was a high purity superconducting composition having the following Y/Ba/Cu mole ratio: 1/.4/3.1.

EXAMPLE 6

This example describes a process for producing high purity superconducting material within the scope of the present invention.

The same procedure as that described in Example 1 was used. In this procedure 76.4 grams of hydrated yttrium nitrate and 148.5 grams of hydrated cupric nitrate were combined with water to form an aqueous solution. Simultaneously, 260 grams of hydrated barium hydroxide was dissolved in water. The two solutions were combined in the same manner as described in Example 1. Following mixing of the two solutions, 900 milliliters of a total of 2000 milliliters of total solution were removed in order to control the barium content of the final product. The resulting precipitate was recovered and processed according to the teachings of Example 2.

The final product was a high purity superconducting composition having the following Y/Ba/Cu mole ratio: 1/1.9/3.2.

EXAMPLE 7

This example describes a process for producing high purity superconducting material within the scope of the present invention.

The same procedure as that described in Example 1 was used. In this procedure 38.2 grams of hydrated yttrium nitrate and 71 grams of hydrated cupric nitrate were combined with water to form an aqueous solution. Simultaneously, 126 grams of hydrated barium hydroxide was dissolved in water. The two solutions were combined in the same manner as described in Example 1. Following mixing of the two solutions, 1200 milliliters of a total of 2400 milliliters of total solution were removed in order to control the barium content of the final product. The resulting precipitate was recovered and processed according to the teachings of Example 2.

The final product was a high purity superconducting composition having the following Y/Ba/Cu mole ratio 1/1.86/2.78.

EXAMPLE 8

This example describes a process for producing high purity superconducting material within the scope of the present invention.

The same procedure as that described in Example 1 was used. In this procedure 38.2 grams of hydrated yttrium nitrate and 71 grams of hydrated cupric nitrate were combined with water to form an aqueous solution. Simultaneously, 126 grams of hydrated barium hydroxide was dissolved in water. The two solutions were combined in the same manner as described in Example 1. In addition, a surfactant was added during the mixing step to provide a more finely divided powder. Following mixing of the two solutions, 1000 milliliters of a total of 2250 milliliters of total solution were removed in order to control the barium content of the final product.

The resulting precipitate was recovered and processed according to the teachings of Example 2.

The final product was a high purity superconducting composition having the following Y/Ba/Cu mole ratio: 1.26/3.0.

EXAMPLE 9

In this example, the same procedure as that set forth in Example 1 is used; however, sufficient barium hydroxide is added to bring the total solution pH to approximately 3.5.

The composition that is obtained is generally green in color and is found to have poorer conductivity than that produced in Example 1. The composition is, however, found to be superconductive in the liquid nitrogen temperature range.

EXAMPLE 10

In this example, the same procedure as that set forth in Example 1 is used; however, sufficient barium hydroxide is added to bring the total solution pH to approximately 11.

The composition that is obtained is generally black in color and is found to have lower current carrying capacity than that produced in Example 1. The composition is, however, found to be superconductive in the liquid nitrogen temperature range.

EXAMPLE 11

The same procedure as that set forth in Example 1 is conducted; however, a platinum electrode is dipped into the mixture and an electrical current is passed through the electrode causing the precipitate to coat the electrode. This procedure produces an electrode coated with a high temperature superconducting material having the chemical formula $YBa_2Cu_3O_{7-x}$.

EXAMPLE 12

The same procedure set forth with respect to Example 1 is used. However, a silver substrate is dipped into the solution following mixture of the solution causing the precipitate to coat the substrate. This procedure produces a substrate coated with a high temperature superconducting material having the chemical formula $YBa_2Cu_3O_{7-x}$.

EXAMPLE 13

The same procedures as those followed in Example 1 are followed except that in the place of yttrium nitrate, lanthanum nitrate is substituted. A high temperature superconducting material is produced having the chemical formula $LaBa_2Cu_3O_{7-x}$.

EXAMPLE 14

The same procedures as those followed in Example 1 are followed except that in the place of yttrium nitrate, praseodymium nitrate is substituted. A high temperature superconducting material is produced having the chemical formula $PrBa_2Cu_3O_{7-x}$.

EXAMPLE 15

The same procedures as those followed in Example 1 are followed except that in the place of yttrium nitrate, neodymium nitrate is substituted. A high temperature superconducting material is produced having the chemical formula $NdBa_2Cu_3O_{7-x}$.

EXAMPLE 16

The same procedures as those followed in Example 1 are followed except that in the place of yttrium nitrate, samarium nitrate is substituted. A high temperature superconducting material is produced having the chemical formula $SmBa_2Cu_3O_{7-x}$.

EXAMPLE 17

The same procedures as those followed in Example 1 are followed except that in the place of yttrium nitrate, europium nitrate is substituted. A high temperature superconducting material is produced having the chemical formula $EuBa_2Cu_3O_{7-x}$.

EXAMPLE 18

The same procedures as those followed in Example 1 are followed except that in the place of yttrium nitrate, gadolinium nitrate is substituted. A high temperature superconducting material is produced having the chemical formula $GdBa_2Cu_3O_{7-x}$.

EXAMPLE 19

The same procedures as those followed in Example 1 are followed except that in the place of yttrium nitrate, terbium nitrate is substituted. A high temperature superconducting material is produced having the chemical formula $TbBa_2Cu_3O_{7-x}$.

EXAMPLE 20

The same procedures as those followed in Example 1 are followed except that in the place of yttrium nitrate, dysprosium nitrate is substituted. A high temperature superconducting material is produced having the chemical formula $DyBa_2Cu_3O_{7-x}$.

EXAMPLE 21

The same procedures as those followed in Example 1 are followed except that in the place of yttrium nitrate, holmium nitrate is substituted. A high temperature superconducting material is produced having the chemical formula $HoBa_2Cu_3O_{7-x}$.

EXAMPLE 22

The same procedures as those followed in Example 1 are followed except that in the place of yttrium nitrate, erbium nitrate is substituted. A high temperature superconducting material is produced having the chemical formula $ErBa_2Cu_3O_{7-x}$.

EXAMPLE 23

The same procedures as those followed in Example 1 are followed except that in the place of yttrium nitrate, thulium nitrate is substituted. A high temperature superconducting material is produced having the chemical formula $TmBa_2Cu_3O_{7-x}$.

EXAMPLE 24

The same procedures as those followed in Example 1 are followed except that in the place of yttrium nitrate, ytterbium nitrate is substituted. A high temperature superconducting material is produced having the chemical formula $YbBa_2Cu_3O_{7-x}$.

EXAMPLE 25

The same procedures as those followed in Example 1 are followed except that in the place of yttrium nitrate, lutetium nitrate is substituted. A high temperature superconducting material is produced having the chemical formula $LuBa_2Cu_3O_{7-x}$.

SUMMARY

In summary, the present invention accomplishes the objectives set forth above. The present invention provides methods for producing compositions of extremely high purity which are useful as high temperature superconducting materials. The present invention provides methods whereby high temperature superconducting ceramics can be produced using solution chemistry. The procedures disclosed above minimize non-uniform mixing and multiphase materials which result from techniques such as the mixture of various powders, frequently used to produce high temperature superconducting materials.

The present invention provides methods whereby high purity superconducting materials are produced. This is achieved by starting with high purity materials and by adjusting pH using only the components of the final superconducting material. No additional acids, bases, or organic solvents need be used. Thus, it is a simple matter to remove excess barium from the final product in order to give a very pure superconducting material. There is no need to also remove other extraneous acids, bases or solvents.

It will be appreciated that the present invention provides methods which will be highly useful in the development of superconducting materials which are economically practical, including particularly superconducting materials which are superconducting at temperatures which can be achieved using liquid nitrogen as a coolant. For example, it is not necessary using the materials of the present invention to employ liquid helium as a coolant. Therefore, the possibility of employing in practical applications the materials developed using the present invention is greatly increased. Indeed, it may be readily practical to use these materials in magnets, motors, electrical transmission lines, computers, and other similar applications.

It will be appreciated that the present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. The method of producing a superconducting material precursor of high purity having the general formula $MBA_2Cu_3O_{7-x}$ where x is from about 0 to 0.5, which comprises the steps of:

providing a first aqueous solution comprising M and copper nitrates wherein M is selected from the group consisting of yttrium and the rare earth elements;

heating said first solution to a temperature of from about 85 to 100° C.;

providing a second aqueous solution comprising barium hydroxide;

heating said second solution to a temperature of from about 80 to 110° C.;

mixing said solutions whereby a precipitate forms; and removing said precipitate from the mixture;

whereby a high purity precursor suitable for use in making a high $T_c$ superconductor results.

2. The method as recited in claim 1 wherein a sufficient quantity of said second solution is mixed with said first solution to provide a mixed solution pH of from about 3 to 13.

3. The method as recited in claim 1 wherein a sufficient quantity of said second solution is mixed with said first solution to provide a mixed solution pH of from about 6 to 9.

4. The method as recited in claim 1 wherein the temperatures of said first and second solutions are such that the mixed solution has an initial temperature from about 85 to 95° C.

5. The method as recited in claim 1 where said mixing is accomplished by gradual, continuous mixing of small quantities of the solutions.

6. The method as recited in claim 1 wherein said precipitate is removed from said mixture of solutions by centrifuging said mixture.

7. The method as recited in claim 1 wherein said first aqueous solution consists essentially of water, M nitrates and copper nitrates and said second solution consists essentially of water and barium hydroxide.

8. The method of producing a superconducting material of high purity having the general formula $MBA_2Cu_3O_{7-x}$ where x is from about 0 to 0.5, which comprises the steps of:

providing a first aqueous solution comprising M and copper nitrates wherein M is selected from the group consisting of yttrium and the rare earth elements;

heating said first solution to a temperature of from about 85 to 100° C;

providing a second aqueous solution comprising barium hydroxide;

heating said second solution to a temperature of from about 80 to 110° C.;

mixing said solutions whereby a precipitate forms;

removing said precipitate from the mixture; and calcining said precipitate whereby a superconducting material results.

9. The method as recited in claim 8 wherein a sufficient quantity of said second solution is mixed with said first solution to provide a mixed solution pH of from about 3 to 13.

10. The method as recited in claim 8 wherein a sufficient quantity of said second solution is mixed with said first solution to provide a mixed solution pH of from about 6 to 9.

11. The method as recited in claim 8 wherein said precipitate is calcined in an atmosphere comprising oxygen at a temperature of from about 600 to 950° C.

12. The method as recited in claim 8 including the further step of sintering said calcined precipitate in an atmosphere comprising oxygen to a temperature of from about 600 to 1000° C.

13. The method as recited in claim 12 including the further step of slowly cooling the sintered precipitate in an atmosphere comprising oxygen to a temperature of from about 400 to 460° C.

14. The method as recited in claim 8 where said mixing is accomplished by gradual, continuous mixing of small quantities of the solutions.

15. The method as recited in claim 8 wherein said precipitate is removed from said mixture of solutions by centrifuging said mixture.

16. The method as recited in claim 8 wherein said first aqueous solution consists essentially of water, M nitrates and copper nitrates and said second solution consists essentially of water and barium hydroxide.

* * * * *